United States Patent
Moll et al.

(10) Patent No.: US 7,052,618 B2
(45) Date of Patent: May 30, 2006

(54) NANOSTRUCTURES AND METHODS OF MAKING THE SAME

(75) Inventors: Nicolas J. Moll, Woodside, CA (US); Daniel B. Roitman, Menlo Park, CA (US); Jennifer Q. Lu, San Jose, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 31 days.

(21) Appl. No.: 10/766,639

(22) Filed: Jan. 28, 2004

(65) Prior Publication Data

US 2005/0164132 A1 Jul. 28, 2005

(51) Int. Cl.
*B44C 1/22* (2006.01)

(52) U.S. Cl. .................. 216/11; 216/41; 430/322; 977/700; 977/773

(58) Field of Classification Search .................. 216/11, 216/41; 977/DIG. 1, 700, 773; 430/322
See application file for complete search history.

(56) References Cited

U.S. PATENT DOCUMENTS

| | | | |
|---|---|---|---|
| 5,782,954 A * | 7/1998 | Luk | 75/252 |
| 6,346,189 B1 * | 2/2002 | Dai et al. | 205/766 |
| 2001/0006851 A1 * | 7/2001 | Choi et al. | 438/710 |
| 2002/0136681 A1 | 9/2002 | Smalley et al. | |
| 2003/0026754 A1 | 2/2003 | Clarke et al. | |
| 2003/0170167 A1 | 9/2003 | Nikolaev et al. | |
| 2004/0256662 A1 * | 12/2004 | Black et al. | 257/317 |
| 2005/0084613 A1 * | 4/2005 | wang et al. | 427/282 |

FOREIGN PATENT DOCUMENTS

WO   WO 03/050332   6/2003

OTHER PUBLICATIONS

Jing Kong et al., Synthesis of individual singel-walled carbon nanotubes on patterned silicon wafers, Nature, vol. 395, pp. 878-881 (Oct. 1998).

Christian Klinke, Jean-Marc Bonard and Klaus Kern, "Thermodynamic calculations on the catalytic growth of carbon nanotubes," AIP Conf. Proc. 685(1) 447 (Oct. 20, 2003).

Y. Zhang, Y. Li, W. Kim, D. Wang, H. Dai., "Imaging as-grown single-walled carbon nanotubes originated from isolated catalytic nanoparticles," Appl. Phys. A, vol. 74, 325-328 (2002).

Georg S. Duesberg, Andrew P. Graham, Maik Liebau, Robert Seidel, Eugen Unger, Franz Kreupl, and Wolfgang Hoenlein, "Growth of Isolated Carbon Nanotubes with Lithographically Defined Diameter and Location," Nano Letters, vol. 3, Issue 2, 2003, pp. 257259.

Peter Kruse, Erin R. Johnson, Gino A. DiLabio, and Robert A. Wolkow, "Patterning of Vinylferrocene on HSi(100) via Self-Directed Growth of Molecular Lines and STM-Induced Decomposition," Nano Letters, vol. 2, 8, pp. 807-810 (2002).

* cited by examiner

*Primary Examiner*—Shamim Ahmed

(57) ABSTRACT

Nanostructures and methods of making the same are described. In one aspect, a film including a vector polymer comprising a payload moiety is formed on a substrate. The film is patterned. Organic components of the patterned film are removed to form a payload-comprising nanoparticle.

28 Claims, 4 Drawing Sheets

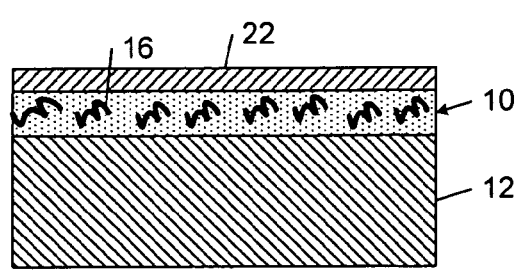
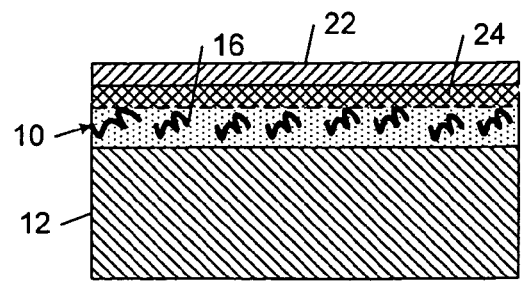
FIG. 3A  FIG. 3B
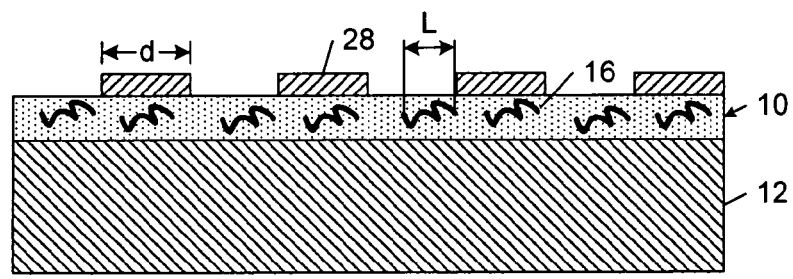
FIG. 4
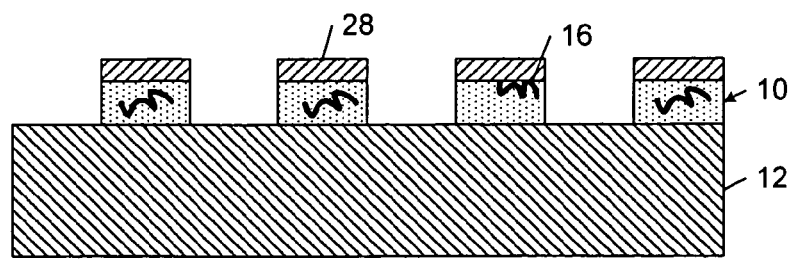
FIG. 5

NANOSTRUCTURES AND METHODS OF MAKING THE SAME

BACKGROUND

Nanostructures are structures that have sizes ranging from about 0.5 nanometers (nm) to about 1 micrometer (μm). Nanostructures exist in a wide variety of different forms, including nanoparticles and nanotubes. As used herein, the term "nanoparticle" refers to a physical composition of matter characterized by a size (e.g., diameter) ranging from about 0.5 nm to about 100 nm. The term "nanotube" refers to an elongated hollow or solid structure having a cross section or diameter less than 1 μm. Carbon nanotubes, for example, typically are hollow graphite tubules that typically have diameters ranging on the order of about 1–50 nm. Carbon nanotubes typically have rigid three-dimensional carbon structures that have high surface areas, low bulk density, and high crush strength.

Nanoparticles in the size range of 1–50 nm have been attached to substrates for a variety of purposes, including many applications that leverage the catalytic properties of certain nanoparticles. Many techniques generate surfaces that are coated with a random distribution of nanoparticles. For example, Klinke et al. ("Thermodynamic calculations on the catalytic growth of carbon nanotubes," AIP Conf. Proc. 685(1) 447 (20 Oct. 2003)), describe a thin film formed by dipping or spin-casting of $Fe(NO_3)_3$ dissolved in propanol can then be thermally treated so that it forms small $Fe_2O_3$ nanoparticles. Zhang et al. ("Imaging as-grown single-walled carbon nanotubes originated from isolated catalytic nanoparticles," Appl. Phys. A, Vol. 74, 325–328 (2002)) describe the use of hollow proteins such as ferritin to capture and store Fe species and subsequently form ferric oxide nanoparticles by removing the host protein. Kong et al. ("Synthesis of individual single-walled carbon nanotubes on patterned silicon wafers," NATURE, Vol. 395, 29 Oct. 1998, pp 878 ff.) describe mixing $Fe(NO_3)_3$ solution with $Al_2O_3$ nanoparticles and forming iron oxide nanoparticles onto the $Al_2O_3$ matrix. In all of these methods the placement of the iron-containing nanoparticles is random.

Other nanoparticle generation techniques have been proposed in which the locations of the nanoparticles on a surface are controlled with lithographic precision. For example, U.S. Pat. No. 6,346,189 describes a method of forming carbon nanotubes on catalyst islands. The catalyst islands are formed by exposing an underlying substrate through holes etched in a photoresist layer. The holes are about 3–5 μm in size and are spaced apart by a distance of about 10 μm. A solution of $Fe(NO_3)_3$ in methanol mixed with alumina nanoparticles about 15–30 nm in size is deposited on the photoresist and the surface areas of the substrate exposed by the holes. A lift-off process is performed to leave isolated islands of $Fe(NO_3)_3$-coated alumina nanoparticles adhering to regions of the substrate that were exposed by the holes in the photoresist. The substrate is heated to decompose the $Fe(NO_3)_3$ into $Fe_2O_3$. Single-walled nanotubes are formed by heating the substrate and exposing the catalyst islands to pure methane at a temperature of about 850–1000° C.

SUMMARY

The invention features nanostructure apparatus and methods of making the same. The invention enables nanoparticles to be formed with precisely-controlled sizes and at locations that are controlled with lithographic precision.

In one aspect of the invention, a film including a vector polymer containing a payload moiety is formed on a substrate. The film is patterned. Organic components of the patterned film are removed to form a payload-containing nanoparticle.

In another aspect of the invention, a film including a vector polymer is formed containing one or more types of repeat units. At least one of the repeat unit types contains a payload moiety. The film is patterned. Organic compoents of the patterned film are removed to respective nanoparticles containing an average number of payload moiety-containing components substantially equal to the number of payload-moiety-containing repeat units in the vector polymer.

In another aspect, the invention features apparatus that includes a set of substantially identical substrates, wherein at least one reference feature is disposed on each substrate, and at least one nanoparticle is disposed on each substrate. The nanoparticles have an average size of at most 10 nm and are positioned relative to respective reference features on corresponding substrates within a range of distances distributed with a standard deviation of at most 0.1 μm.

Other features and advantages of the invention will become apparent from the following description, including the drawings and the claims.

DESCRIPTION OF DRAWINGS

FIG. 3A is a diagrammatic cross-sectional side view of a photoresist layer formed over the vector-polymer-containing film shown in FIG. 2.

FIG. 3B is a diagrammatic cross-sectional side view of an optional barrier layer disposed between an overlying photoresist layer and the vector-polymer-containing film shown in FIG. 2.

FIG. 4 is a diagrammatic cross-sectional side view of a patterned photoresist layer formed on the vector-polymer-containing film shown in FIG. 2.

FIG. 5 is a diagrammatic cross-sectional side view of the photoresist layer and the vector-polymer-containing film shown in FIG. 4 after the photoresist pattern has been transferred to the vector-polymer-containing film.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

Figure 1:
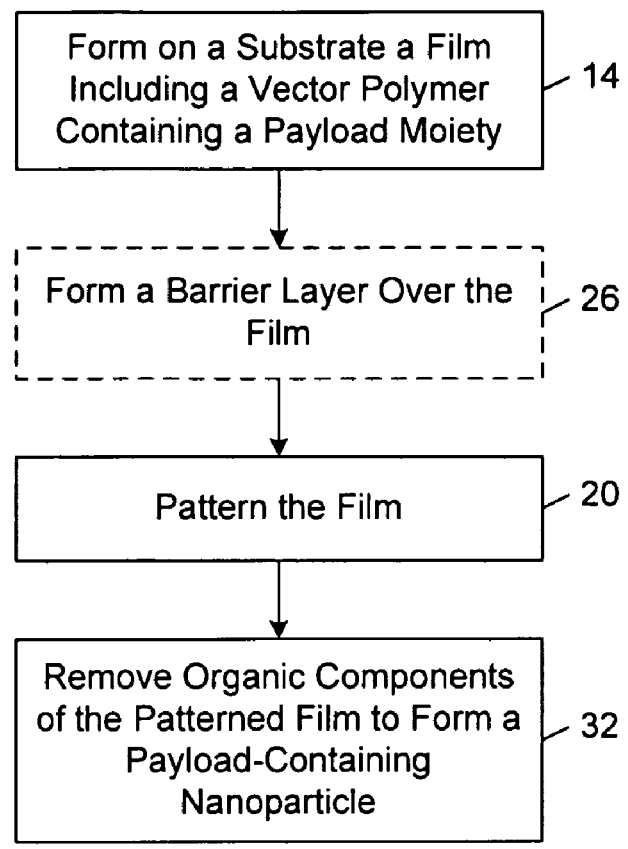
FIG. 1 is a flow diagram of a nanostructure fabrication method.

FIG. 1 shows an embodiment of a method of fabricating a nanostructure that involves patterning a film including a vector polymer that has a payload moiety, and removing organic components of the patterned film to form a payload-containing nanoparticle. This method enables nanoparticles to be formed with precisely-controlled sizes and at locations that may be controlled with lithographic precision.

Figure 2:
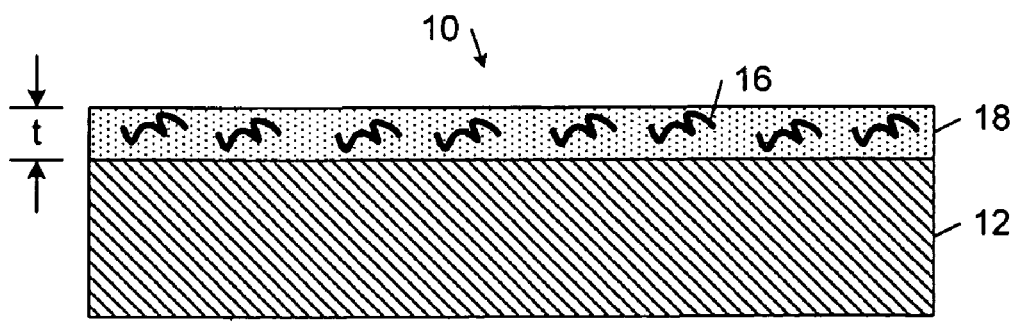
FIG. 2 is a diagrammatic cross-sectional side view of a vector-polymer-containing film formed on a substrate.

Referring to FIGS. 1 and 2, a film 10 is formed on a substrate 12 (process 14). The substrate 12 may be any type of substrate that is compatible with the lithographic processes and the organic component removing processes described in detail below. Exemplary substrate materials include silicon, alumina, quartz, silicon oxide, and silicon nitride.

Film 10 includes a vector polymer 16 dispersed in a polymer binder 18. Film 10 may be formed on substrate 12 by spin-casting a mixture of the vector polymer 16 and the polymer binder 18 dissolved or dispersed in a casting liquid, which allows film 10 to be formed with a uniform thickness across substrate 12. The term "mixture" refers to a combination of two or more components which may be in the form of a solution (i.e., a mixture of a solute in a corresponding solvent) or a suspension (i.e., when particles are mixed with but undissolved in a fluid). In some cases, a given mixture initially may be in the form of a solution, but over time or with certain treatment the mixture may be transformed into a suspension. Standard spin-casting equipment that is used in the semiconductor industry to form layers of photoresist on substrates may be used to form film 10. As explained in detail below, in some implementations, the thickness (t) of film 10 and the relative proportions of the vector polymer 16 and the polymer binder 18 are selected to achieve a distribution of vector polymer molecules across the surface of substrate 12 that allows the ratio of the number of vector polymer molecules used to form each nanoparticle to be controlled with a prescribed statistical accuracy.

The vector polymer 16 is a polymer that may be processed to deliver the payload moiety on the surface of substrate 12. As used herein, the term "polymer" refers to a chemical compound or mixture of compounds formed by polymerization and consisting essentially of repeating structural units. A polymer may have a large number of repeating structural units or a polymer may have relatively few repeating structural units, in which case the polymer often is referred to as an "oligomer". In some implementations, the vector polymer 16 includes multiple types of repeat units at least one of which includes the payload moiety so that the total number of payload moieties in the vector polymer 16 is equal to the number of payload-containing repeat units. The payload moiety is any atomic or molecular species that can be used to form a nonvolatile nanoparticle on the substrate surface. The nonvolatile nanoparticles may be an aggregation of payload moieties or have a composition of matter derived from an aggregation of payload moieties. The payload moiety may be attached or otherwise complexed to the repeat unit of the vector polymer 16 in the form of an independent atomic or molecular species or as part of a group of atoms, such as a radical group. Exemplary payload moieties include metal species (e.g., transition metal species, such as iron, molybdenum and zinc, or other metal species, such as gold, depending on the desired properties of the nanoparticles to be formed on the surface of substrate 12) and semiconductor species (e.g., elemental semiconductor species, such as silicon and germanium, and compound semiconductor species, such as III-V and II-VI semiconductor compounds).

The polymer binder 18 substantially inhibits phase separation of the vector polymer 16 during the film formation and lithography patterning process. In some implementations, the polymer binder 18 includes ligands that are attracted to at least some portion of the vector polymer 16 to substantially inhibit such phase separation.

In some exemplary implementations, the payload moiety of the vector polymer 16 includes iron atoms, which are used for forming nanoparticles containing iron oxide. An exemplary iron-containing vector polymer is polyvinyl ferrocene that includes a number of repeat units corresponding to the average number of iron atoms desired in the nanoparticles to be formed on substrate 12. Iron-containing vector polymers may be dispersed in any one of a wide variety of different polymer binders, including poly(dimethylglutarimide) (PMGI), poly(ethylenimine), poly (vinyl pyridine), poly (vinyl alcohol), poly (ethylene/acrylic acid), poly (acrylic acid) and its sodium salt, poly (maleic acid), poly(dimethylglutarimide), polyamic acid, poly (methyl methacrylic acid), poly (ethylene glycol), and poly (propylene glycol). The polyvinyl ferrocene vector polymer and the polymer binder may be dissolved or dispersed in a mutual solvent, such as cyclohexanone, to form the mixture that is used to form film 10.

Other iron-containing vector polymers include poly (iron III acrylate) and diblock polymers consisting of a chain of an iron-containing polymer spliced to a chain that has an identical repeat unit as the polymer binder 18. Exemplary vector polymer/polymer binder combinations of this type include: a polystyrene-b-iron-complexed poly(vinyl pyridine) vector polymer dispersed in a polystyrene polymer binder; and a polymethyl methacrylate-b-poly (iron III acrylate) vector polymer dispersed in a polymethyl methacrylate polymer binder.

In some embodiments, the vector polymer is a diblock polymer A–B, where A consists of the payload-containing repeat units and B consists of non-payload-containing repeat units. In some implementations, the B repeat units contain C, H, N and O atoms, which are removed during the process of removing organic components described below. In some of these implementations, the B material also contains atoms, such as silicon or aluminum moieties. During the organic component removing process, these latter groups coalesce into silicon oxide, silicon nitride, aluminum oxide or aluminum nitride. If the payload units in these implementations consist of iron, then the final results produce iron oxide nanoparticles entrained within a aluminum oxide(nitride) or silicon oxide(nitride) matrix. Systems of this type provide excellent adhesion of the iron oxide nanoparticles and prevent aggregation. This type of inorganic polymer also may be used as a polymer binder or as a part of the polymer binder.

Referring to FIGS. 1, 3A, 3B, and 4, after the film 10 has been formed on substrate 12 (process 14), the film 10 is patterned (process 20). In the illustrated embodiments, the film 10 is patterned by transferring a pattern lithographically formed in an overlying photoresist layer 22 to the underlying film 10. In some implementations, the photoresist layer 22 is formed directly on the film 10, as shown in FIG. 3A. In other implementations, a barrier layer 24 (e.g., a low-temperature plasma-enhanced chemical vapor deposition (PECVD) oxide layer) is formed between the photoresist layer 22 and the film 10 to protect the film 10 against degradation during patterning, as shown in FIG. 3B (process 26). The photo resist layer 24 may be patterned using standard semiconductor photolithographic patterning techniques (e.g., standard optical and electron beam lithography techniques). In some embodiments, the photoresist layer 22 is patterned into an array of cylindrical dots 28, as shown in cross-section in FIG. 4. The sizes of the dot patterns depend at least in part on the sizes of the final nanoparticles to be formed and the properties (e.g., the length) of the vector polymer molecules. In one exemplary implementation for fabricating nanoparticles 1–10 nm in size from a ferrocene vector polymer with 200 iron-atom-containing repeat units, the cylindrical dots are 500 nm in diameter (d).

As shown in FIG. 5, the photoresist pattern is transferred to the underlying film layer 10 to complete the patterning process (process 20). The pattern may be transferred using a standard organic etching process. For example, in some implementations, a dry-etching process, such as a plasma etching process (e.g., a reactive ion etching process) is used to transfer the photoresist pattern to the film 10. In some implementations, an additional etching or cleaning process may be needed to remove residual contamination from the locations between the locations of the patterned film. For example, iron-based contamination may be cleaned with a wet etchant, such as a dilute mixture of hydrochloric acid and water.

Figure 6:
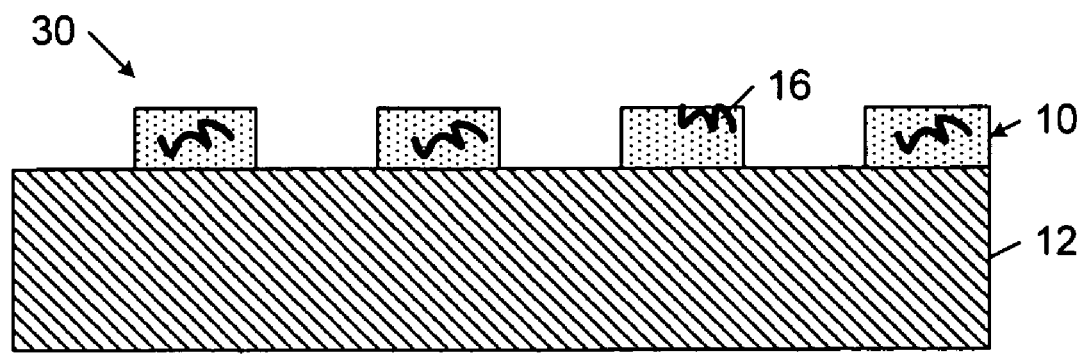
FIG. 6 is a diagrammatic cross-sectional side view of the patterned vector-polymer-containing film shown in FIG. 5 after the overlying patterned photoresist layer has been removed.

Referring to FIG. 6, after the photoresist pattern has been transferred to the film 10, the remainder of the patterned photoresist layer 22 is removed using standard photoresist removal techniques, such as rinsing the photoresist in a photoresist solvent. After the photoresist has been removed, the patterned film is disposed on the surface of substrate 12 in the form of precursor nanoparticles 30. In the illustrated embodiments, substantial phase separation of the vector polymer 16 and the polymer binder 18 is avoided during the patterning process (process 26) either because the vector polymer complexes with the polymer binder or, in the case where the vector polymer is a diblock polymer A–B, because the polymer binder has repeat units corresponding to block B and therefore acts as a strong dispersant for the diblock vector polymer. Avoiding phase separation between the vector polymer and the polymer binder prevents the vector polymer molecules from clustering and, thereby, creates a nonuniform distribution of vector polymer molecules in film 10, where some domains have a high vector polymer concentration and other domains have a low vector polymer concentration. In this way, a uniform distribution of vector polymer molecules is maintained, allowing each precursor nanoparticle 30 to behave as a closed system having the same probability of containing the target number of vector polymer molecules.

In implementations in which a diblock vector polymer is used, phase separation is substantially avoided during the patterning process. Although thermal processing during the patterning process may cause the diblock vector polymer molecules to coil, the vector polymer and the polymer binder do not phase separate to create a nonuniform distribution of vector polymer molecules in film 10. For example, with polystyrene-b-iron-complexed poly(vinyl pyridine) the iron-complexed poly(vinyl pyridine) end of the chain will form a coil, but the polystyrene end of the chain behaves like the polystyrene polymer binder, preventing clustering of the vector polymer molecules.

In some implementations, various physical and chemical parameters are selected so that on average a single instance of the vector polymer 16 is contained within each of the precursor nanoparticles 30 that are formed by the film patterning process. This result is achieved by proper selection of the thickness (t) of film 10, the size (e.g., the diameter d) of the photoresist patterns, and the ratio of the vector polymer 16 concentration to the polymer binder 18 concentration in film 10. For a spin-cast film thickness t, and photoresist pattern dots with a diameter d, the volume of each patterned precursor nanoparticle 30 is $\pi t d^2/4$, which is about $2\times10^7$ nm$^3$ for an implementation in which t is 100 nm and d is 500 nm. In an exemplary embodiment in which the vector polymer is (vinyl ferrocene)$_{200}$, the molecular weight of the vector polymer is 42,400, the weight of a single 200-mer is approximately $7.04\times10^{-20}$ grams, and the weight concentration of polyvinyl ferrocene in a PMGI polymer binder is 3.5 ppm (parts per million), assuming that the density of PMGI is 1.00 grams per cubic centimeter. This set of parameters produces a substantially uniform distribution of (vinyl ferrocene)$_{200}$ on substrate 12 that allows on average a single instance of (vinyl ferrocene)$_{200}$ to be contained within each of the precursor nanoparticles 30.

In some instances, the precursor nanoparticles 30 contain truncated portions of the vector polymer 16. Assuming that the vector polymer molecules are substantially stretched out parallel to the surface of substrate 12 with a characteristic length L, which is proportional to the number of repeat units in the vector polymer, the vector polymer truncation probability (P) may be approximated by equation (1):

$$P = \frac{\pi d^2 - d^2(\theta - \sin\theta)}{\pi d^2} \approx \frac{4L}{\pi d} \quad (1)$$

where $\theta = 2\text{Arcos}(L/d)$. For L<<d, the ratio of truncated to full-size vector polymer molecules in precursor nanoparticles 30 is approximately $1.27\,L/d$. In the case of (vinyl ferrocene)$_{200}$, L is estimated to be at most 76 nm and, assuming d is 500 nm, the truncation probability is about 20%. In the case of diblock vector polymer film formulations where the iron-containing block has coiled, the length L that is used to compute the truncation probability in equation (1), above, should be the coil diameter of the vector polymer rather than its length, substantially reducing the truncation probability.

In addition to truncation considerations, the statistical distribution of vector polymers in each precursor nanoparticle 30 also determines the structure of the final nanoparticles. This distribution is determined by Poisson statistics. Assuming there are N vector polymer molecules per precursor nanoparticle, there is a standard deviation of $N^{0.5}$ molecules per precursor nanoparticle. In one illustrative example, if N is set to 1, in an array of 100 precursor nanoparticles, there will be on average thirty-seven precursor nanoparticles without any vector polymer molecules, thirty-seven precursor nanoparticles with exactly one vector polymer molecule, and twenty-six precursor nanoparticles that contain two or more vector polymer molecules. In some applications, nanoparticles formed from the precursor nanoparticles containing two or more vector polymer molecules (or nanostructures formed from such nanoparticles) may exhibit properties that are different from the properties exhibited by the nanoparticles formed from precursor nanoparticles containing exactly one vector polymer (or nanostructures formed from such nanoparticles). This allows the uniform population of nanoparticles made from precursor nanoparticles containing exactly one vector polymer to be identified and isolated from non-conforming nanoparticles and used in a desired application.

Figure 7:
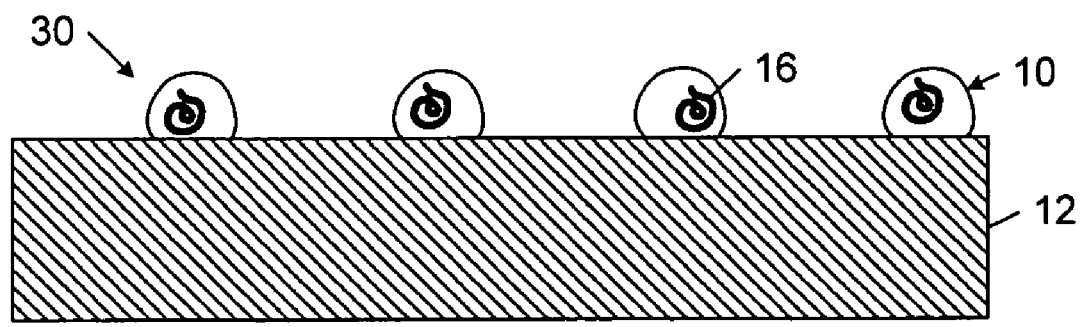
FIG. 7 is a diagrammatic cross-sectional side view of precursor nanoparticles corresponding to reflowed versions of the patterned vector-polymer-containing film shown in FIG. 6.
Figure 8:
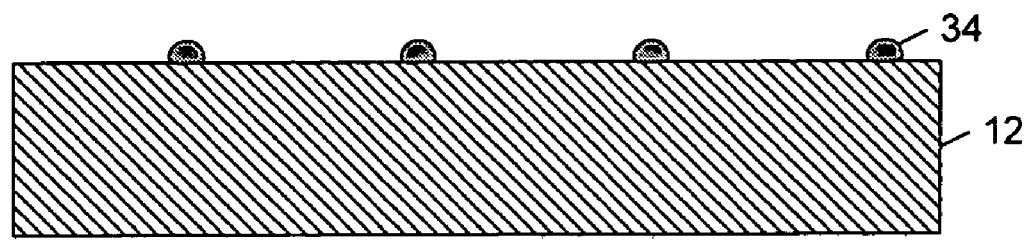
FIG. 8 is a diagrammatic cross-sectional side view of nanoparticles formed on the substrate after substantially all organic moieties have been removed from the precursor nanoparticles shown in FIG. 7.

Referring back to FIG. 1 and to FIGS. 7 and 8, organic components of the precursor nanoparticles 30 corresponding to the patterned film islands are removed to form respective payload-containing nanoparticles (process 32). During this process the respective volumes of the precursor nanoparticles 30 are reduced (e.g., by removing or driving-off unwanted components or moieties of the vector polymer and the polymer binder) and leaving behind a higher concentration of the desired final payload-moiety-containing nanoparticle composition or by conversion of the inorganic polymer component into inorganic matrix such as Silicon Oxide, Silicon Nitride, Aluminum Oxide and Aluminum Nitride.

In some implementations, the precursor nanoparticles 30 initially are reflowed by heating the precursor nanoparticles 30 to a temperature above a glass transition temperature of a component of the patterned film. The predominant component of each precursor nanoparticle 30 typically is the polymer binder, in which case the glass transition temperature of the precursor nanoparticles 30 substantially corresponds to the glass transition temperature of the polymer binder. For example, in implementations in which the polymer binder is PMGI, the precursor nanoparticles 30 are heated to a temperature above the glass transition temperature of PMGI (i.e., 190° C.) to reflow the precursor nanoparticles 30. During the reflow process, each of the precursor nanoparticles 30 reflows to a size and a shape that are determined by the surface energy and the wetting angle of the precursor nanoparticles 30 with respect to the surface of substrate 12.

After the reflowing process, organic moieties in the precursor nanoparticles 30 are removed. In general, organic moieties may be removed by any process that selectively decomposes organic components of the precursor nanoparticles 30 and leaves respective nonvolatile, payload-containing nanoparticles on the surface of substrate 12. In some implementations, organic moieties are removed by oxidative ablation. In one such implementation, organic moieties are removed by exposing the precursor nanoparticles 30 to UV light and ozone. During the organic moiety removal process, the precursor nanoparticles 30 shrink substantially isotropically toward their respective centers of mass, as shown in FIG. 8. In another implementations, the reduction involves the conversion of the polymer binder or a part of polymer vector into an inorganic matrix surrounding the payload containing particles.

Figure 9:
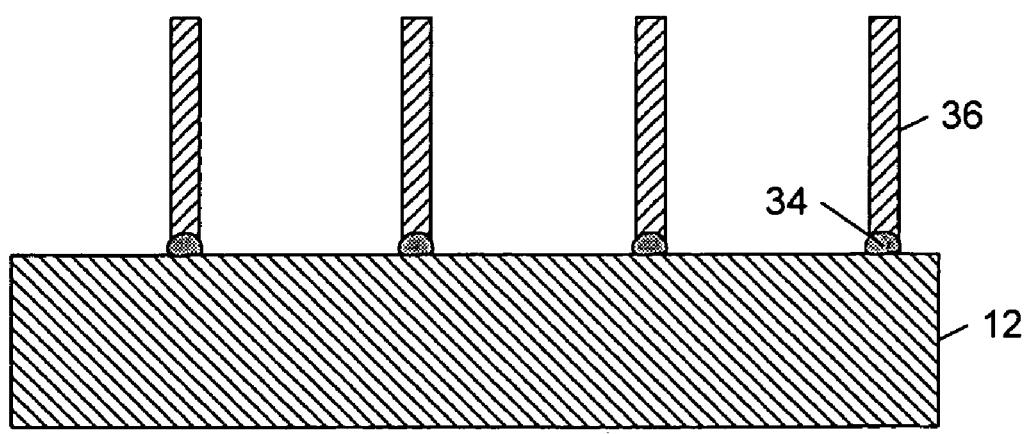
FIG. 9 is a diagrammatic cross-sectional side view of carbon nanotubes extending from the nanoparticles shown in FIG. 8.

The organic moiety removal process removes, most if not substantially all of the organic components of the precursor nanoparticles 30, and leaves a set of respective payload-containing nanoparticles 34 distributed across the surface of the substrate 12, as shown in FIG. 9. As explained above, the payload-containing nanoparticles may correspond exactly to an aggregation of payload moieties or they may be formed of a composition of matter that is derived from an aggregation of payload moieties, or they may be formed of a composition of matter that is derived from the payload moiety of the vector polymer or an aggregation of such payload moieties. For example, in implementations in which the vector polymer is a vinyl ferrocene, the payload moieties are iron atoms. In some of these implementations, the nanoparticles 34 are formed of iron oxide ($Fe_2O_3$), which is generated by oxidative ablation of the vinyl ferrocene polymer in the precursor nanoparticles 30 (e.g., by exposure to UV light and ozone, calcination, or pyrolysis). In other of these implementations, the nanoparticles 34 may be formed of a different iron salt, such as $Fe(SO_4)$. In other exemplary implementations, the vector polymer may be a metallopolymer containing gold moieties, in which case the nanoparticles may be formed of gold.

The embodiments described in detail above enable nanoparticles 34 to be formed at precisely-controlled locations on the surface of substrate 12 as a result of the ability to lithographically place the precursor nanoparticles 30. Such lithographic placement control enables substantially identical substrates to be formed in batches with at least one nanoparticle positioned on the substrate surface relative to respective reference features on corresponding substrates within a range of distances distributed with a standard deviation of at most 0.1 μm, which is a typical lithographic alignment capability in a semiconductor manufacturing environment. The reference features may correspond, for example, to structural features of a device or an integrated circuit formed or being formed on the substrates. In addition, these embodiments enable the resulting nanoparticles 34 to be formed with precisely-controlled sizes within the range of 0.5 nm to about 50 nm as a result of control over the chemistry, thickness and the lithographic patterning of the initial vector-polymer-containing film 10. The sizes of the nanoparticles 34 may be determined by transmission electron microscopy (TEM), atomic force microscopy (AFM) and, for larger particles, scanning electron microscopy (SEM).

The resulting nanoparticles 34 may be used for a wide variety of different applications. For example, in some implementations, the nanoparticles 34 are formed of a material (e.g., iron oxide, molybdenum oxide, zinc oxide, or a mixture of iron, molybdenum and ruthenium oxides, or certain elemental metals) that acts as a catalyst in the formation of carbon nanotubes. As shown in FIG. 10, in implementations in which the size (e.g., the diameter) of the catalytic nanoparticles 34 are typically within a range of 0.5–10 nm, and more typically within a range of 1–3 nm, substantially single-walled carbon nanotubes 36 may be formed at each of the nanoparticles. The single-walled carbon nanotubes 36 extend from the tops of the nanoparticles 34 and have diameters in the range of about 1–5 nm. In some exemplary implementations, the carbon nanotubes 36 may be formed by heating the substrate 12 with the catalytic nanoparticles in a furnace at a temperature of about 850–1000° C. and flowing 99.99% pure methane over the catalytic nanoparticles 34 at a velocity of about 2–20 centimeters per 20 second.

Other embodiments are within the scope of the claims.

What is claimed is:

1. A nanostructure fabrication method, comprising:
  forming on a substrate a film including a vector polymer comprising a payload moiety;
  patterning the film; and
  removing organic components of the patterned film to form a payload-comprising nanoparticle.

2. The method of claim 1, wherein the vector polymer comprises a number of repeat units each comprising the payload moiety.

3. The method of claim 2, wherein the payload moiety includes at least one semiconductor atom.

4. The method of claim 2, wherein the payload moiety includes at least one metal atom.

5. The method of claim 4, wherein the payload moiety includes at least one iron atom.

6. The method of claim 5, wherein the vector polymer is one of a poly(vinyl ferrocene), a poly (iron III acrylate), and an iron-comprising diblock polymer.

7. The method of claim 1, wherein the film includes the vector polymer and a polymer binder.

8. The method of claim 7, wherein the polymer binder contains ligands attracted to the payload moiety.

9. The method of claim 7, wherein the vector polymer includes polyvinyl ferrocene.

10. The method of claim 9, wherein the polymer binder includes one of poly(dimethylglutarimide) (PMGI), poly (ethylenimine), poly (vinyl pyridine), poly (vinyl alcohol), poly (ethylene/acrylic acid), poly (acrylic acid) and its sodium salt, poly (maleic acid), poly(dimethylglutarimide), polyamic acid, poly (methyl methacrylate acid), poly (ethylene glycol), poly(propylene glycol), poly(dialkylsiloxane), polysilane, silsesquioxane, and an aluminum-comprising gel.

11. The method of claim 7, wherein the vector polymer is polystyrene-b-iron-complexed poly(vinyl pyridime) and the polymer binder is polystyrene.

12. The method of claim 7, wherein the vector polymer is polymethyl methacrylate-b-poly (iron III acrylate) and the polymer binder is polymethyl methacrylate.

13. The method of claim 7, wherein the forming comprises spin-casting onto the substrate a mixture comprising the vector polymer and the polymer binder in a casting liquid.

14. The method of claim 1, wherein the vector polymer is a diblock polymer A–B, where A includes multiple repeat units each comprising the payload moiety, and B includes multiple repeat units each comprising C, H, N, and O atoms.

15. The method of claim 14, wherein the repeat units of B each further includes at least one of a silicon moiety and an aluminum moiety.

16. The method of claim 1, wherein the film is formed on the substrate with a thickness less than 120 nm.

17. The method of claim 1, wherein patterning the film comprises applying a photoresist over the film, patterning the photoresist, and transferring the photoresist pattern to the film.

18. The method of claim 17, further comprising forming a barrier layer between the photoresist and the film.

19. The method of claim 1, further comprising reflowing the patterned film by heating the patterned film to a temperature above a glass transition temperature of a component of the patterned film.

20. The method of claim 1, wherein removing organic components comprises removing at least one organic moiety of the patterned film.

21. The method of claim 20, wherein at least one organic moiety is removed by oxidation.

22. The method of claim 1, wherein removing organic components comprises converting the payload moiety from a metal species into a salt.

23. The method of claim 1, wherein removing organic components comprises converting the payload moiety into a non-volatile oxide.

24. The method of claim 1, further comprising forming at least one carbon nanotube at the payload-comprising particle.

25. A nanostructure fabrication method, comprising:
    forming on a substrate a film including a vector polymer comprising a one or more types of repeat units, at least one of the repeat unit types contains a payload moiety;
    patterning the film; and
    removing organic components of the patterned film to form respective nanoparticles comprising an average number of payload-moiety-comprising components substantially equal to the number of payload-moiety-comprising repeat units in the vector polymer.

26. A nanostructure fabrication method, comprising:
    forming on a substrate a film comprising vector polymers each comprising an inorganic payload moiety;
    patterning the film to form discrete regions of the film on the substrate; and
    removing organic components of the discrete regions of the film to form on the substrate respective nonvolatile nanoparticles each comprising the inorganic payload.

27. The method of claim 26, wherein the removing comprises transforming the discrete regions of the film into respective nonvolatile nanoparticles each consisting essentially of at least one of the inorganic payloads.

28. The method of claim 26, wherein the removing comprises transforming the discrete regions of the film into respective nonvolatile nanoparticles each consisting essentially of a composition of matter that is derived from at least one of the inorganic payloads.

* * * * *